(12) United States Patent
Chang (10) Patent No.: US 7,028,389 B2
(45) Date of Patent: Apr. 18, 2006

(54) FIXING DEVICE FOR PRINTED CIRCUIT BOARDS

(75) Inventor: Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 418 days.

(21) Appl. No.: 10/227,393

(22) Filed: Aug. 26, 2002

(65) Prior Publication Data

US 2004/0034994 A1    Feb. 26, 2004

(51) Int. Cl.
*B23P 19/00* (2006.01)
(52) U.S. Cl. .................... 29/739; 29/757; 29/832; 174/52.1; 361/753; 361/801; 411/339
(58) Field of Classification Search .............. 29/736, 29/739, 757, 760, 830, 832; 174/52.1, 138 D, 174/138 G; 361/752–753, 796–804; 411/339, 411/533, 538; 439/92
See application file for complete search history.

(56) References Cited

U.S. PATENT DOCUMENTS

| | | | | |
|---|---|---|---|---|
| 5,381,598 A | * | 1/1995 | Adachi et al. | 29/845 |
| 5,519,169 A | * | 5/1996 | Garrett et al. | 174/35 R |
| 5,620,290 A | * | 4/1997 | Homfeldt et al. | 411/533 |
| 6,424,538 B1 | * | 7/2002 | Paquin | 361/752 |
| 6,535,394 B1 | * | 3/2003 | Hirzmann | 174/138 G |
| 6,695,629 B1 | * | 2/2004 | Mayer | 439/92 |
| 6,741,477 B1 | * | 5/2004 | Sivertsen | 361/752 |
| 6,781,055 B1 | * | 8/2004 | Chen | 174/52.1 |

* cited by examiner

*Primary Examiner*—A. Dexter Tugbang
*Assistant Examiner*—Donghai D. Nguyen
(74) *Attorney, Agent, or Firm*—Birch, Stewart, Kolasch & Birch, LLP (57) ABSTRACT

A fixing device for a printed circuit board (PCB) is comprised of a shaft, an elastic washer and a fixing pillar for fixing the PCB on a shell. This device has the functions of fixing, vibration buffer, and preventing electromagnetic interference (EMI). According to the invention, the shaft penetrates through the PCB and the elastic washer and connects to the fixing pillar on a shell, thereby fixing the PCB onto the shell. The elastic washer is elastic such that it can absorb external vibrations and reduce damages to the PCB. By putting the elastic washer into contact with the PCB, the electromagnetic wave is guided to the shell, thus avoiding the EMI.

11 Claims, 11 Drawing Sheets

FIXING DEVICE FOR PRINTED CIRCUIT BOARDS

BACKGROUND OF THE INVENTION

1. Field of Invention

The invention pertains to a fixing device and, in particular, to a fixing device that fixes a printed circuit board (PCB) onto a shell to provide the functions of vibration reduction and circuit grounding.

2. Related Art

With the tremendous advance in technologies, computers are widely used in all kinds of businesses. Therefore, high-level server uses become more popular. To ensure the stability and reliability of the high-level servers, the problems of electromagnetic interference (EMI) or electromagnetic compatibility (EMC) have received a lot of attention in recent years.

Figure 1:
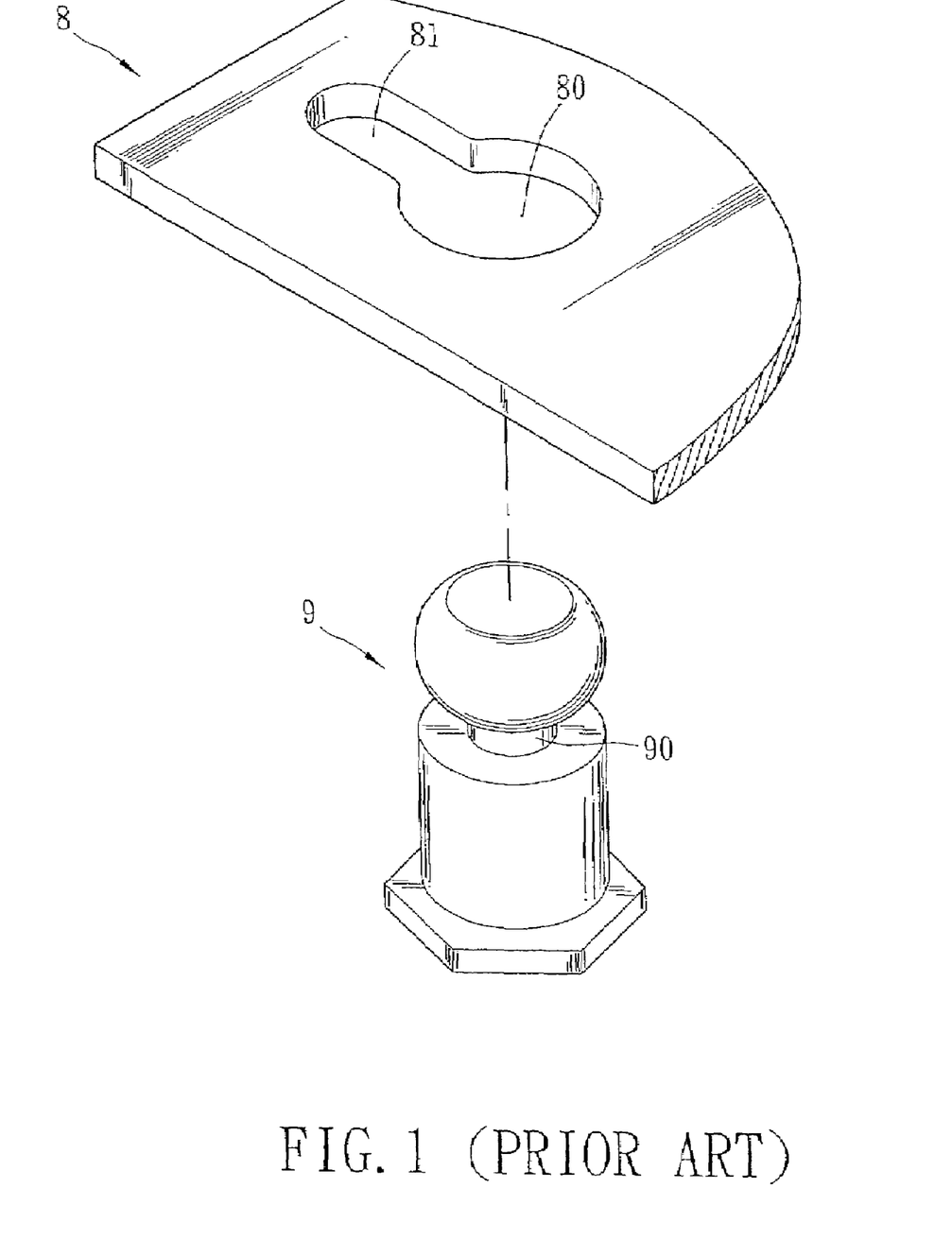
FIG. 1 is a schematic view of a conventional fixing device.
Figure 2:
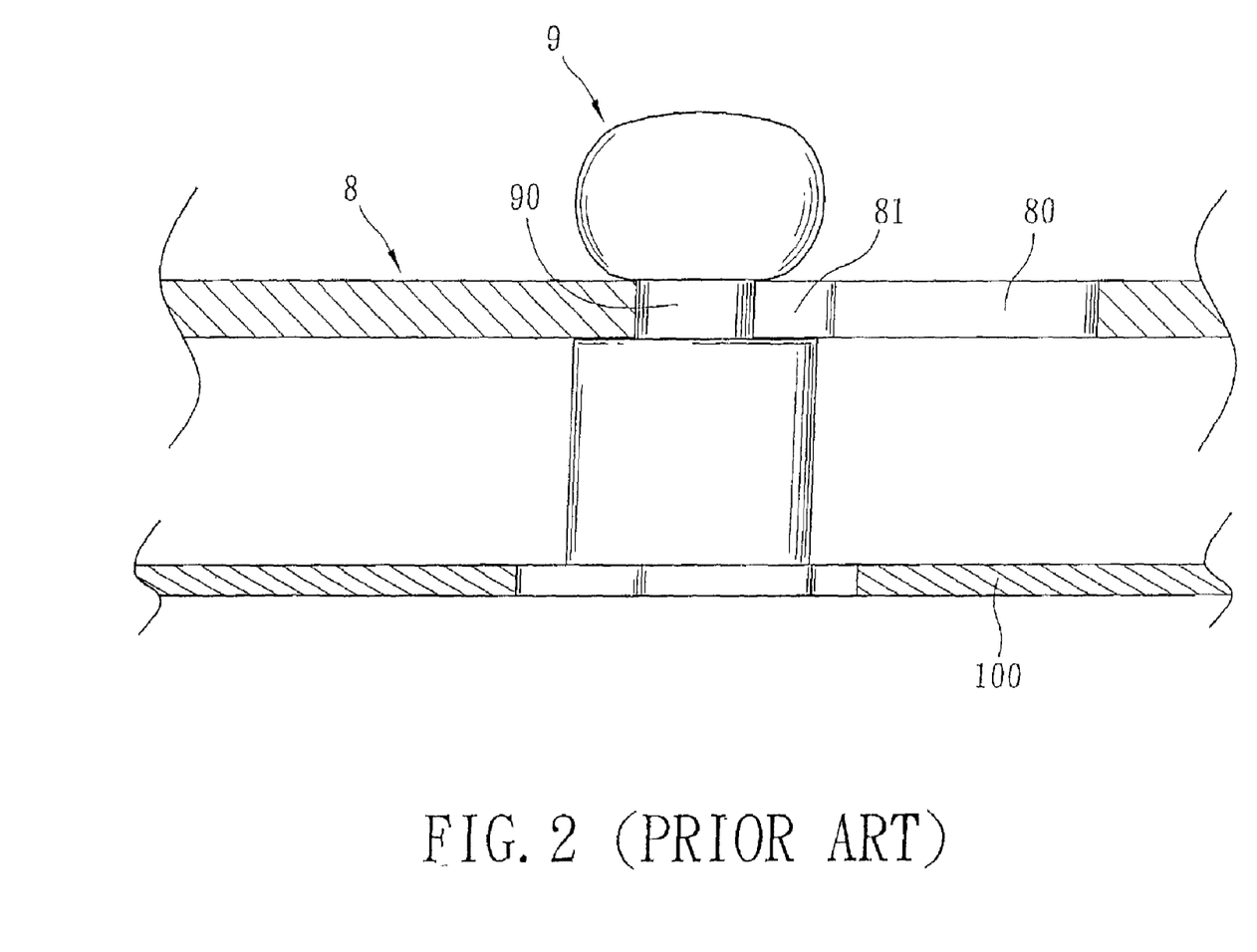
FIG. 2 is a cross-sectional view of FIG. 1.

To solve the above-mentioned problems and to achieve the effect of fixing a PCB to a shell, a conventional means is proposed, as shown in FIGS. 1 and 2. Take a common PCB 8 (computer mother board) as an example. A conductive fixing pillar 9 fixed on a shell 100 penetrates through a ground pad (the through hole 80) on the PCB 8. An adjacent clamping hole 81 then holds the neck 90 of the pillar 9, achieving the goals of both fixing and electric conduction.

Figure 3:
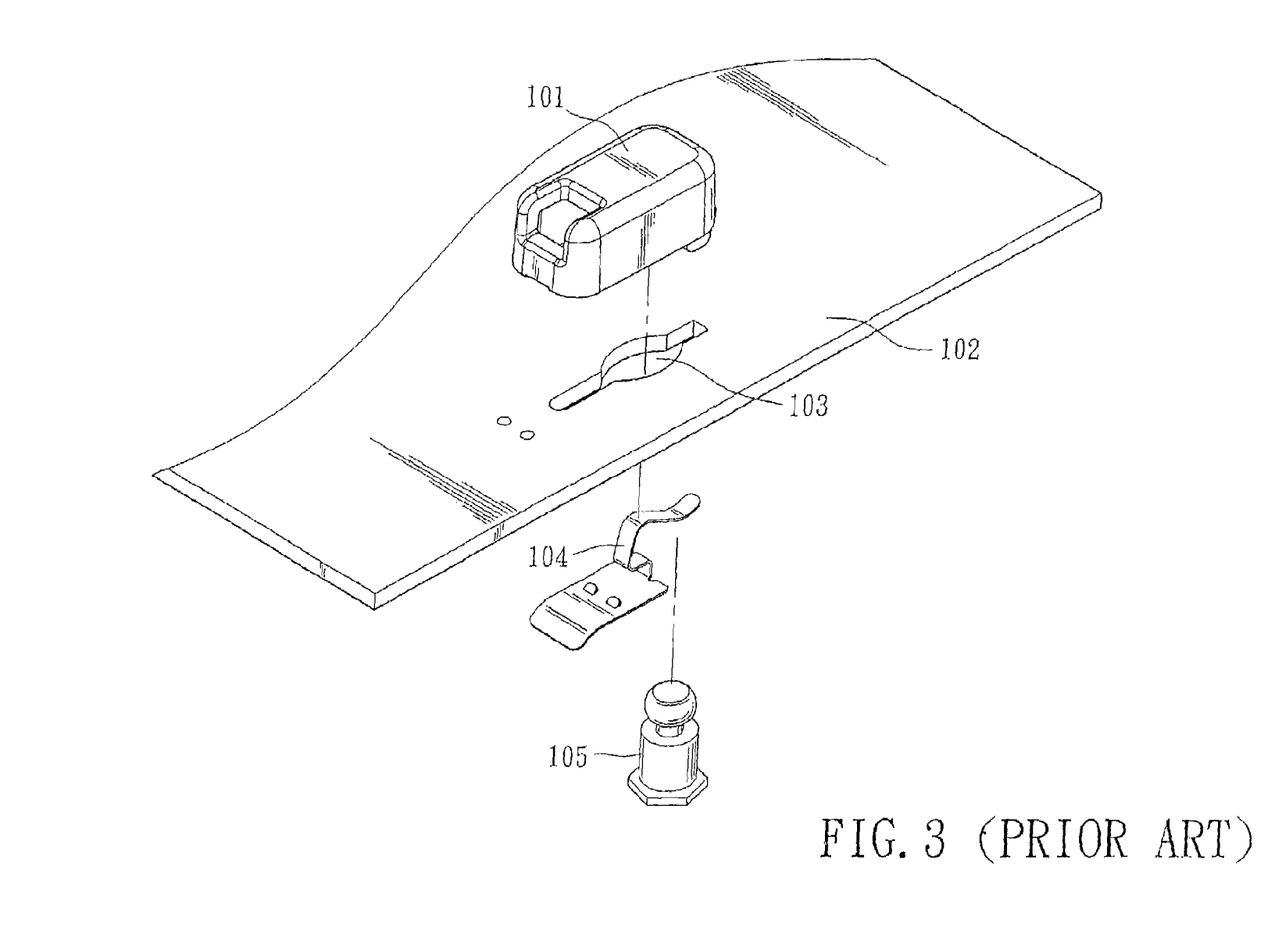
FIG. 3 is a schematic view of another conventional fixing device.
Figure 4:
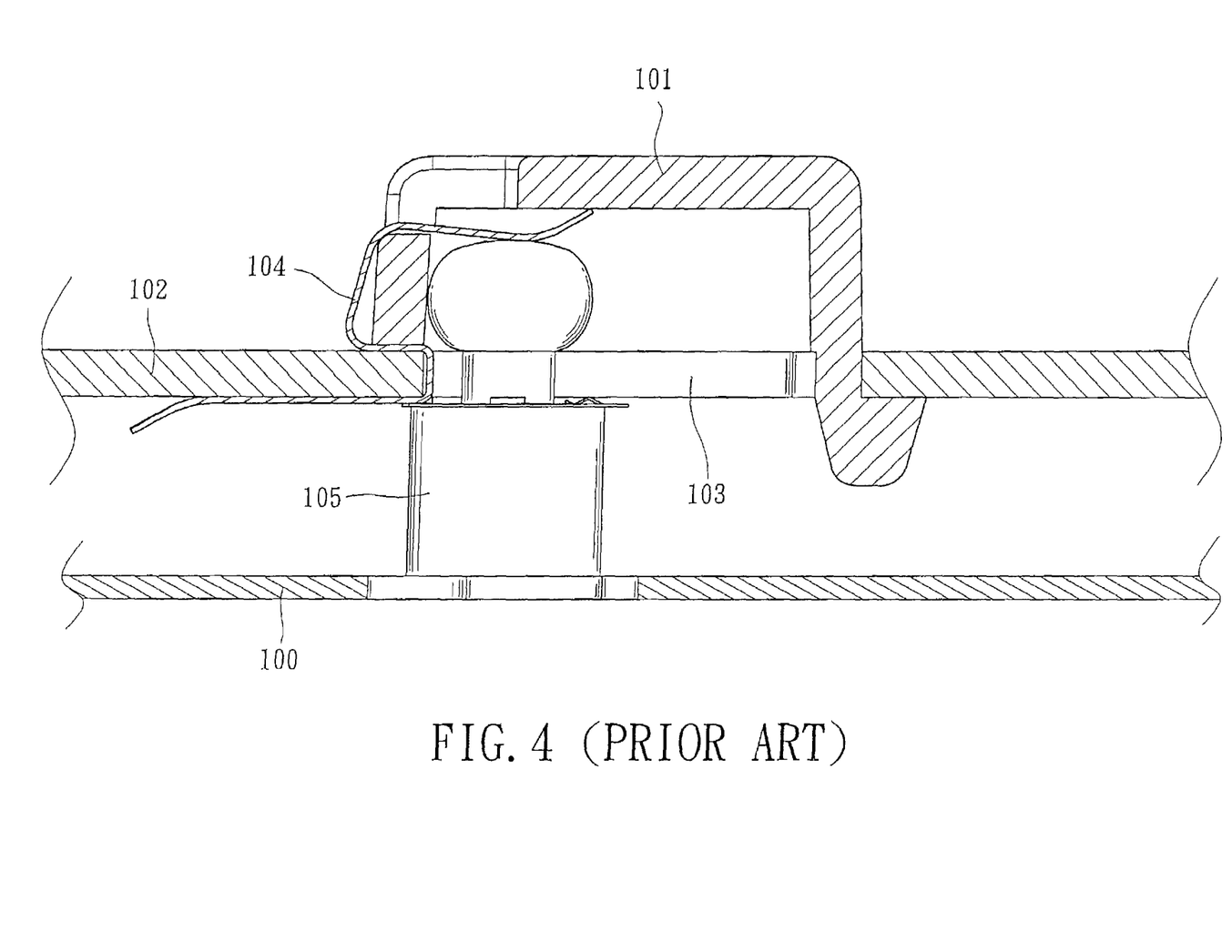
FIG. 4 is a cross-sectional view of FIG. 3.

FIGS. 3 and 4 show another conventional method. First, the elastic washer 104 goes through a ground pad 103 on a PCB 102 and snaps the PCB 102 through a groove. A fixing pillar 105 is then inserted through the same ground pad 103 and pushed to the side, so that the neck of the fixing pillar 105 is held onto the ground pad 103. Finally, the tail of a mask 101 is hooked with the tail of the ground pad 103. An opening above it is provided for the elastic washer 104 to hole the mask 101 and the fixing pillar 105, thereby fixing the PCB 102 onto the shell 100.

However, good EM wave shielding effect and lower costs are hard to simultaneously achieve. Although the example shown in FIGS. 1 and 2 is cheap in its cost, there may be sliding when external vibrations occur. The elastic washer in FIGS. 3 and 4 has a larger contact area with the PCB, providing a better grounding and mask fixing; however, the structure and thus the assembly procedure are complicated. Moreover, one has to reserve extra space when designing the PCB, making the cost increase inevitable.

SUMMARY OF THE INVENTION

To solve the above-mentioned problems, the invention discloses a fixing device for PCB's. The fixing device is comprised of available elements in the industry without special orders. Therefore, the manufacturing cost can be lowered.

An objective of the invention is to prevent EMI, providing a better shielding function.

Another objective of the invention is to provide an elastic device to reduce vibrations.

The disclosed fixing device for PCB's is comprised of a shaft, an elastic washer, and a fixing pillar. The shaft and the fixing pillar are commonly used fixing elements in the industry. The shaft goes through in order the PCB and the elastic washer, and is finally fixed inside a fixture base. The shaft and the elastic washer are conductive. They are connected to the ground through the conductive fixing pillar installed in a computer shell, thereby preventing EMI. The elastic part has a bowl shape and a slit. The elastic part is divided into several blocks and becomes deformable and elastic. The PCB is sandwiched between the elastic washer and the shaft. When the PCB receives external vibrations, the elastic part provides a good buffer to absorb the vibrations.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 5:
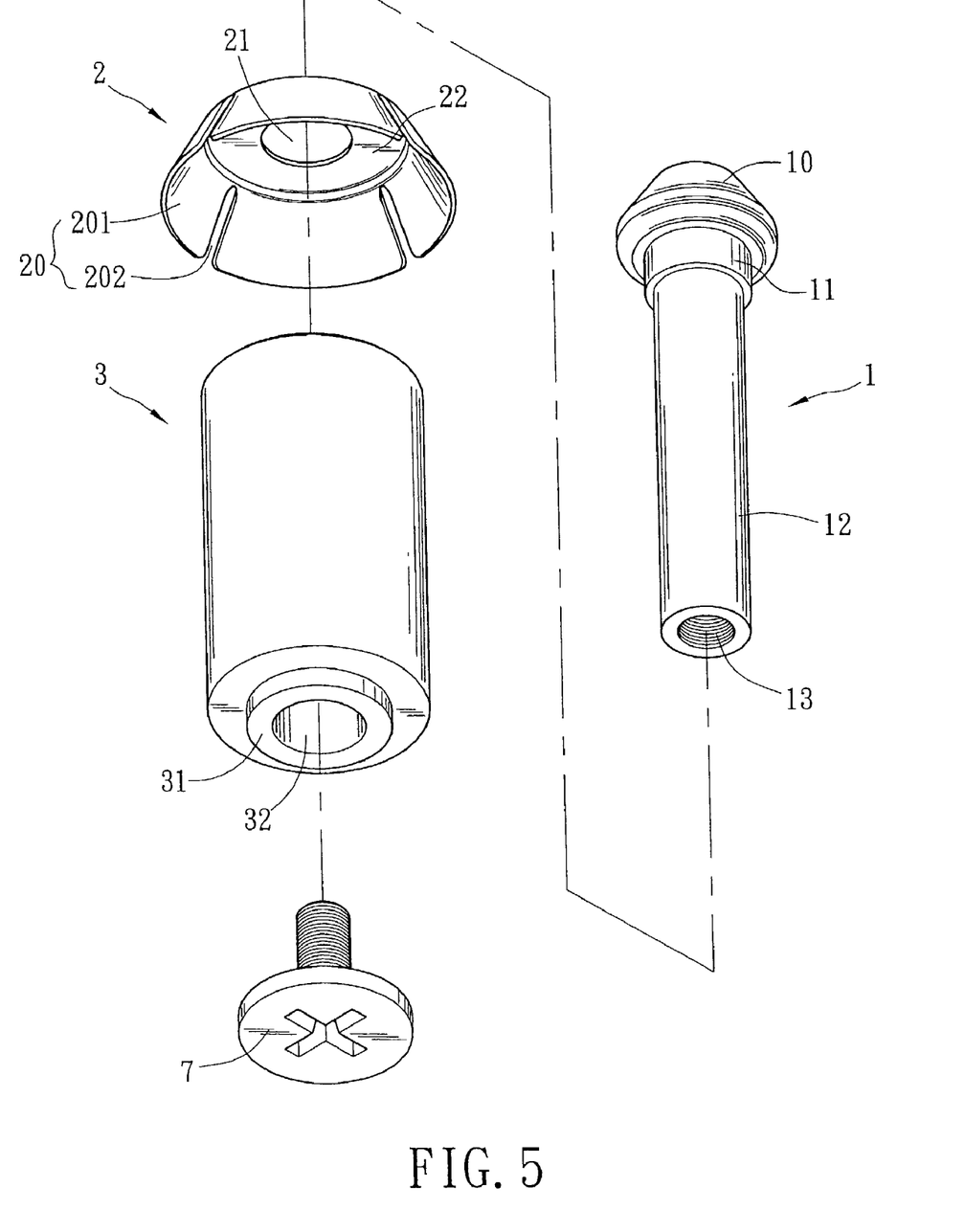
FIG. 5 is a schematic view of the first embodiment of the invention.
Figure 6:
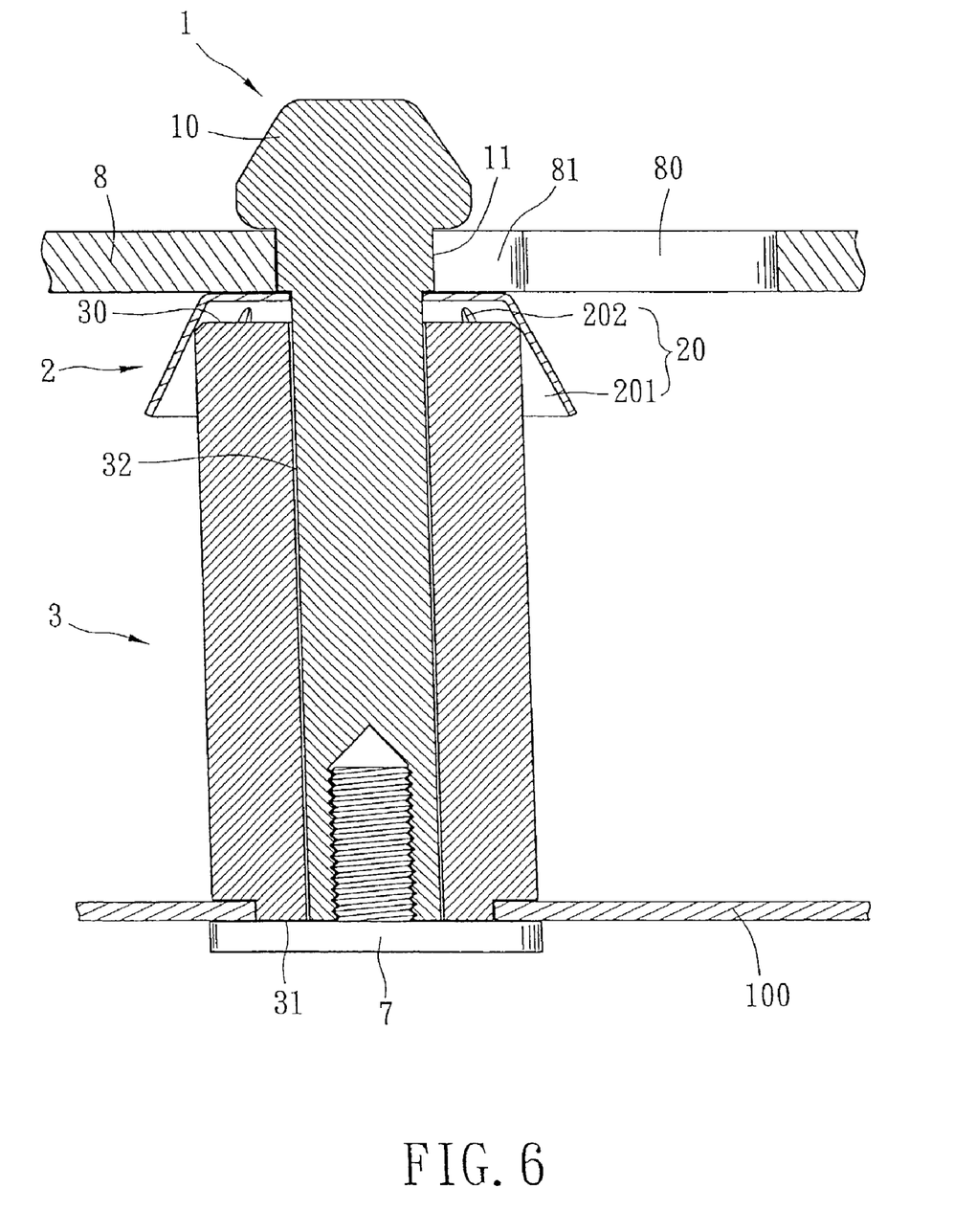
FIG. 6 is a cross-sectional view of FIG. 5.

With reference to FIGS. 5 and 6, showing a first embodiment of the invention, a fixing device for PCB's of the invention is comprised of a shaft 1, an elastic washer 2, and a fixing pillar 3.

Figure 7:
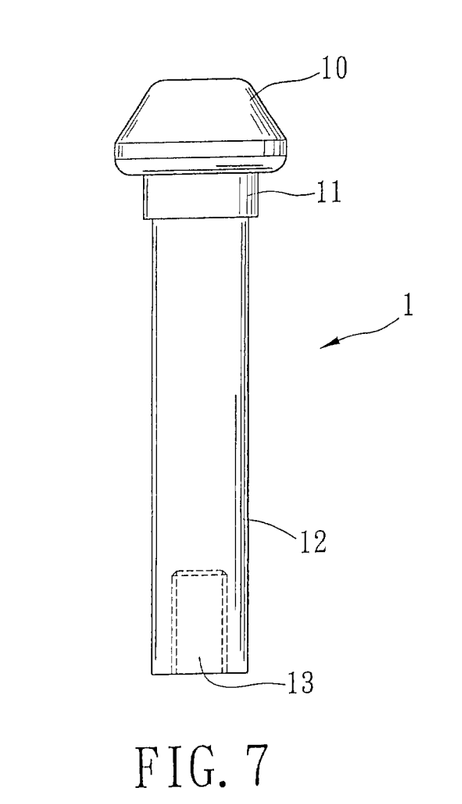
FIG. 7 shows the shaft in the first embodiment.

With reference to FIGS. 6 and 7, the shaft 1 has a head 10 and a connected neck 11. The outer diameter of the head 10 is larger than that of the neck 11. The head 10 goes through an through hole 80 of the PCB 8. A clamping hole 81 holds the neck 11. A post 12 goes through the elastic washer 2 and is fixed inside the fixing pillar 3. The post 12 contains a fixing hole 13 engraved with threads.

Figures 8, 9:
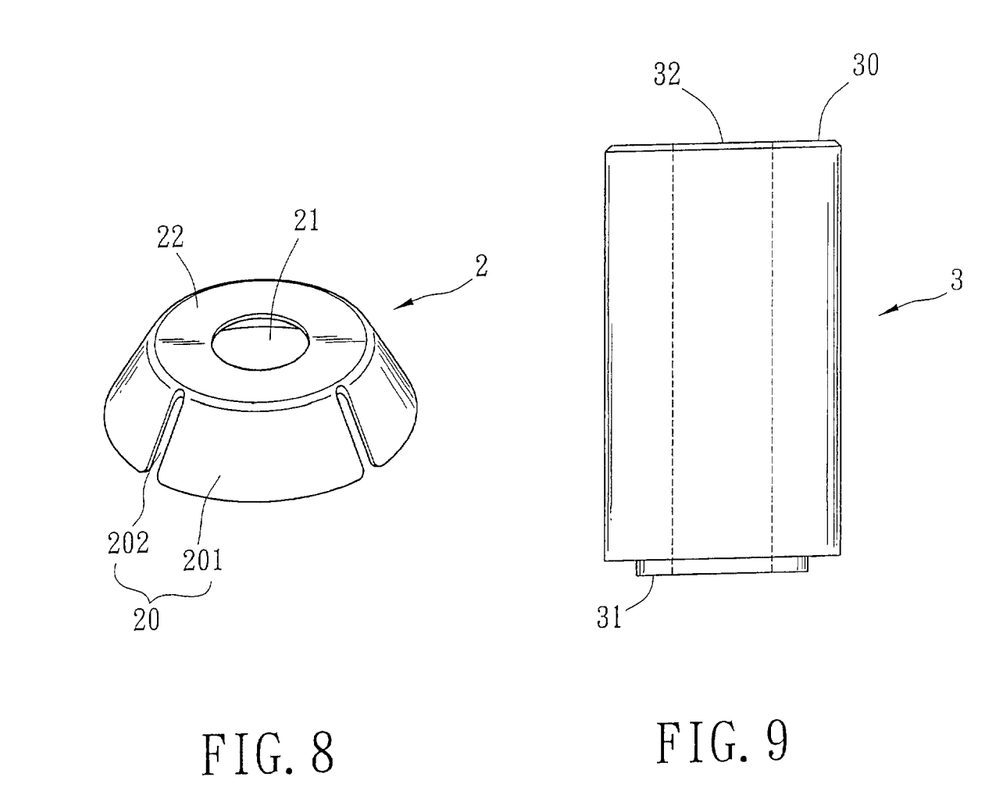
FIG. 8 shows the elastic washer in the first embodiment.
FIG. 9 shows the fixing pillar in the first embodiment.

With reference to FIG. 8, the elastic washer 2 has a bowl shape, a junction surface 22, and a through hole 21 for the shaft 1 to go through. The elastic part 20 is connected to the junction surface 22 and contains several slits 202, which divides the elastic part 20 into several claws 201. Since the elastic washer 2 is divided into several claws 201 and deformable, it is thus able to provide an elastic force.

As shown in FIG. 9, the fixing pillar 3 contains a base 31 and a contact surface 30. The fixing pillar 3 is fixed on the shell via the base 31. The contact surface 30 is connected to the elastic part 20 of the elastic washer 2 and therefore to the ground. In other words, the junction surface 22 of the elastic washer 2 is connected to the PCB, and the elastic part 20 of the elastic washer 2 touches the fixing pillar 3 fixed on the shell. The grounding effect prevents the system from EMI. The contact surface 30 of the fixing pillar 3 has an insert hole 32 for accommodating the post 12 of the shaft 1. The screw 7 is driven into the shaft 1 through the fixing hole 13 engraved with threads in the post 12. Also, the shaft 1 or the fixing pillar 3 can fix by a nail rather than using the screw 7, no showing in FIGS.

Figure 10:
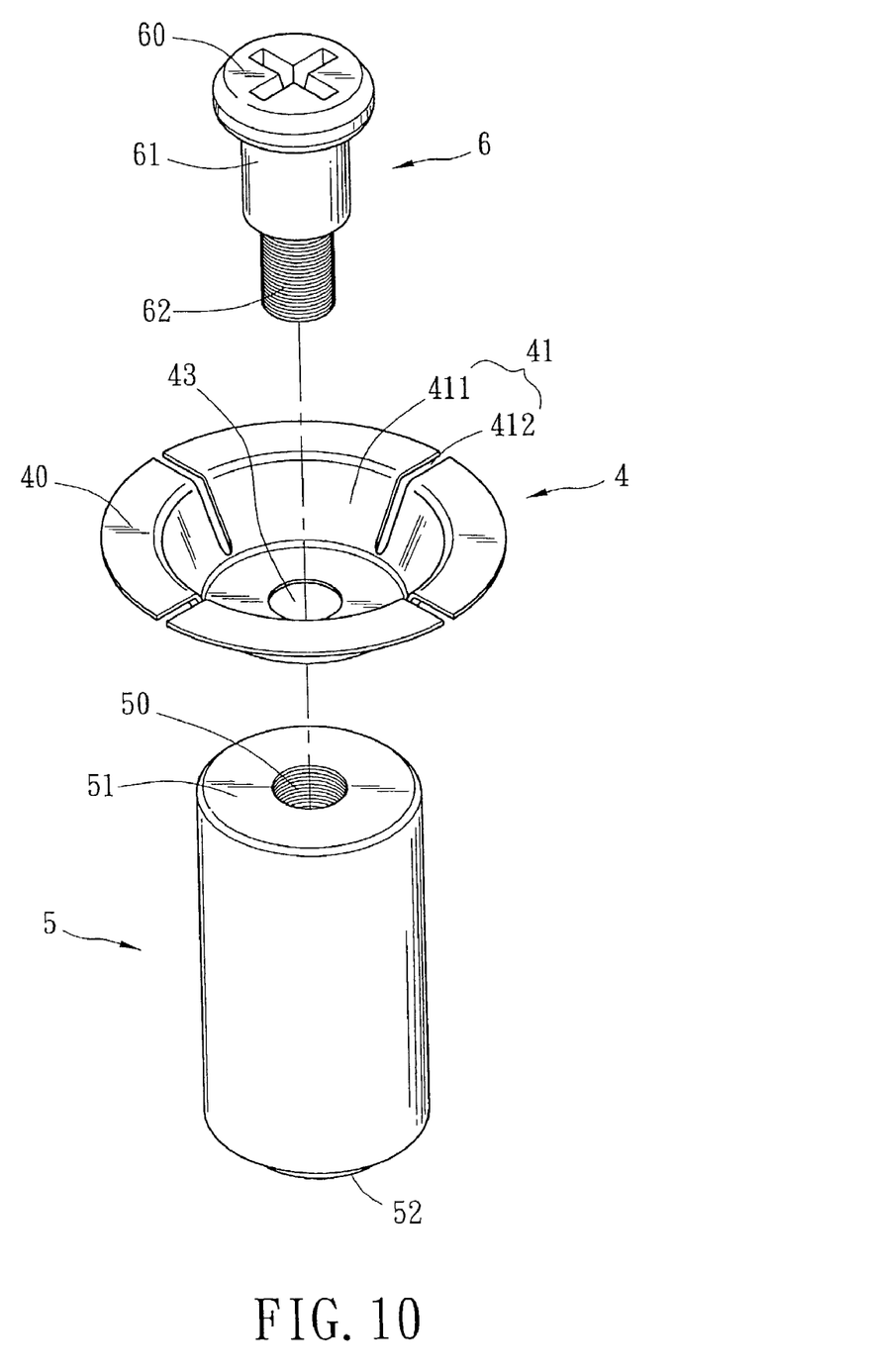
FIG. 10 is a schematic view of the second embodiment of the invention.

With reference to FIG. 10, a second embodiment of the invention, the disclosed fixing device for a PCB consists of an elastic washer 4, a fixing pillar 5, and a shaft 6.

Figure 11:
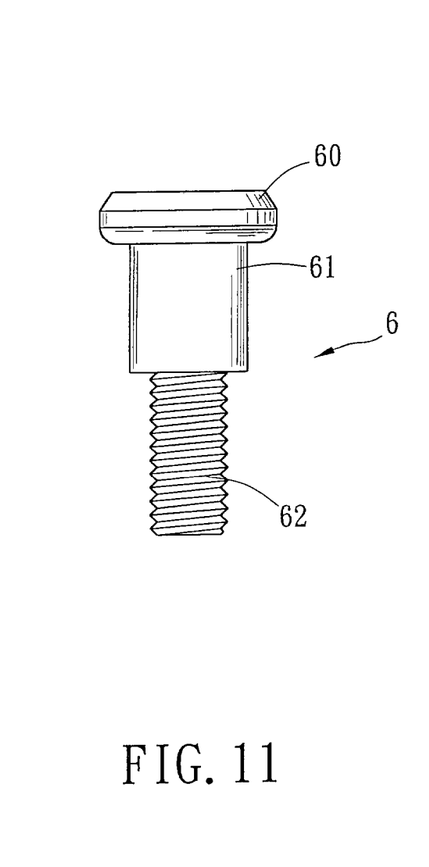
FIG. 11 shows the shaft in the second embodiment.

As shown in FIG. 11, the shaft 6 has a head 60 along with a connected neck 61 and a post 62. The outer diameter of the head 60 is greater than that of the neck 61. Threads are formed on the surface of the post 62.

Figure 12:
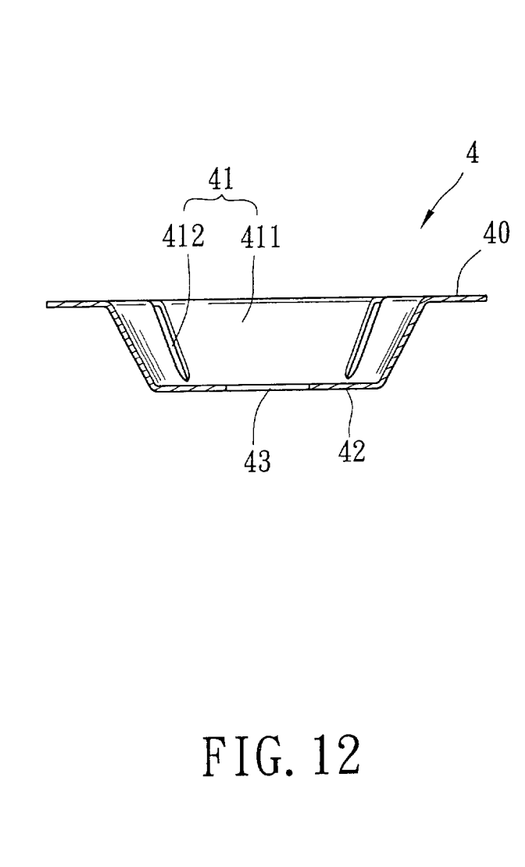
FIG. 12 shows the elastic washer in the second embodiment.

As shown in FIG. 12, the elastic washer 4 has a bowl shape with its opening facing upward and is made of a conductive material. The elastic washer 4 contains a bowl-shaped elastic part 41 and a connected junction surface 42. A through hole 43 is formed at the center of the junction surface 42. The elastic part 41 has a plurality of slits 412 for dividing the elastic part 41 into several claws 411. Therefore, the elastic part 41 becomes deformable and elastic.

Figure 13:
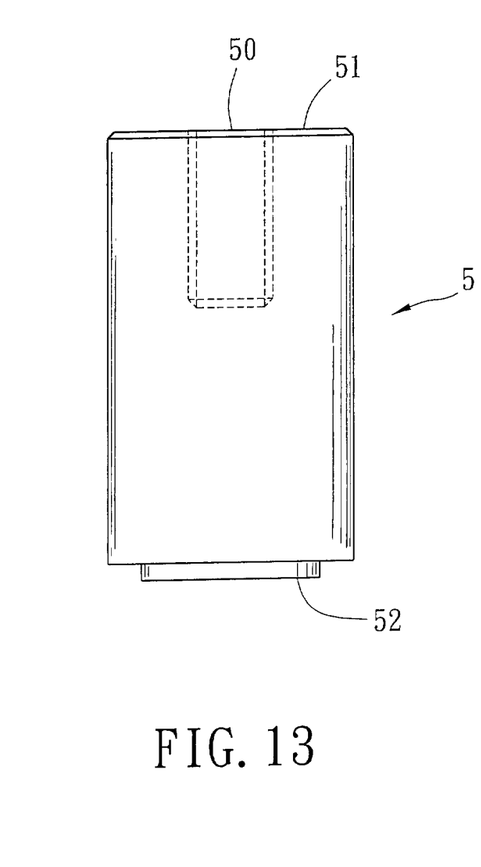
FIG. 13 shows the fixing pillar in the second embodiment.

With reference to FIG. 13, the fixing pillar 5 has a threaded hole 50, a connected contact surface 51, and a base 52. The base 52 is used to fix the fixing pillar 5 onto the shell. The contact surface 51 touches the junction surface 42 of the elastic washer 4. The shaft 6 goes through the through hole 43 and enters the fixing pillar 5. The elastic part 41 has an extended horizontal surface 40 for direct contact with the PCB. The threaded hole 50 accommodates the post 62. As stated, the extended surface 40 of the elastic washer 4 touches the PCB, and the junction surface 42 of the elastic washer 4 is connected with the contact surface 51 of the fixing pillar 5. Therefore, the system is connected to the ground, preventing EMI.

Figure 14:
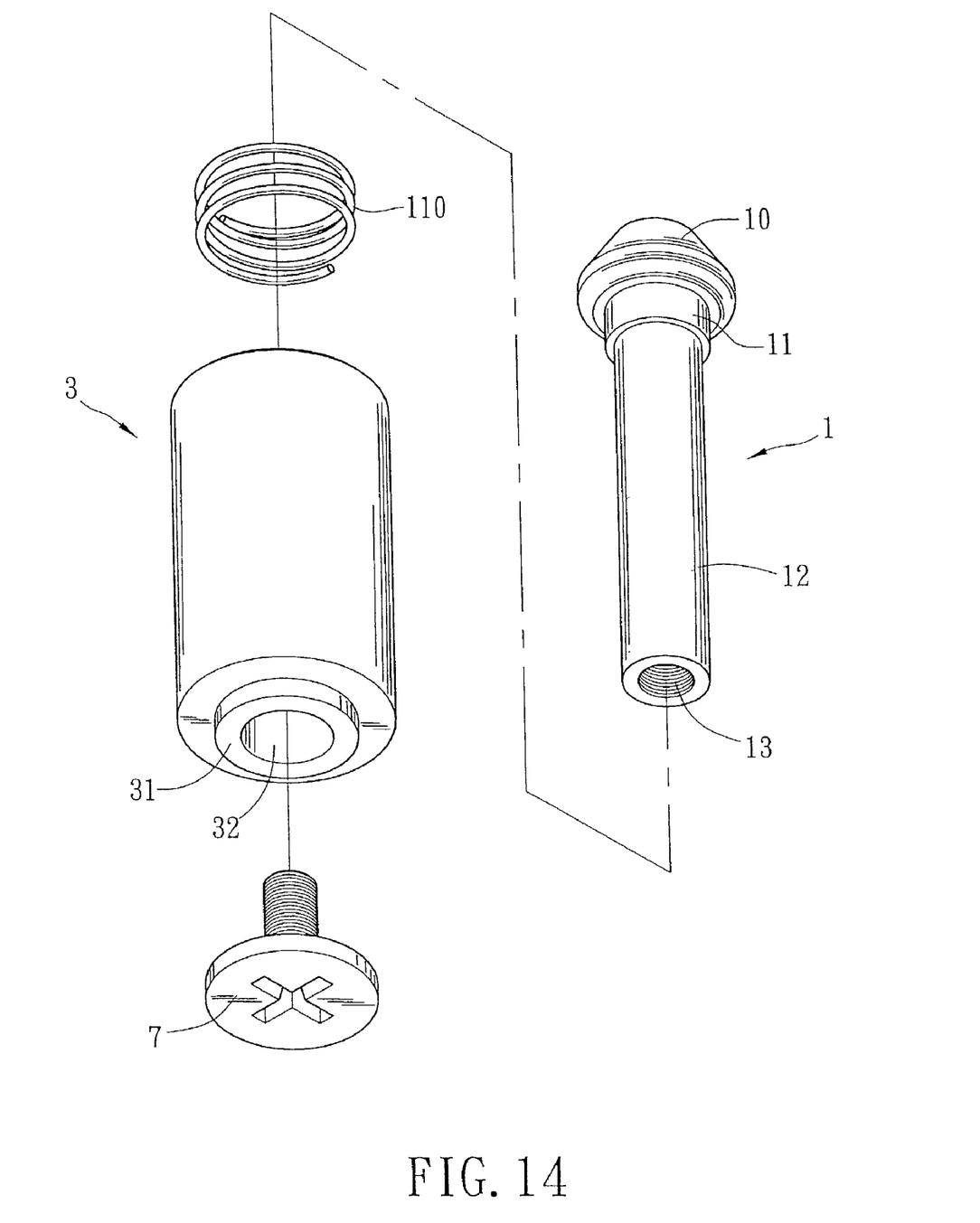
FIG. 14 is a schematic view of the third embodiment of the invention.
Figure 15:
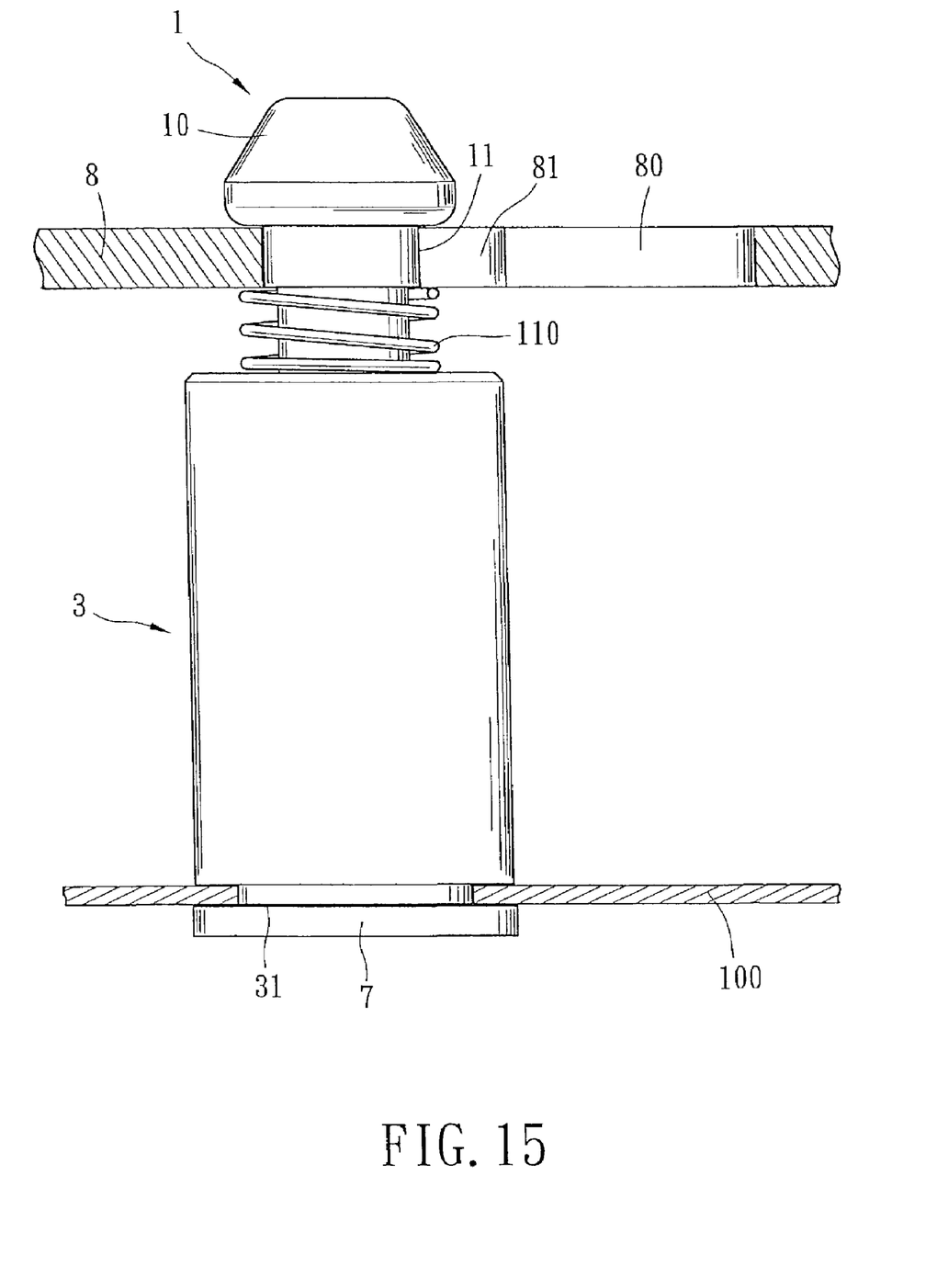
FIG. 15 is a cross-sectional view of FIG. 14.

With reference to FIG. 14, a third embodiment of the invention, a fixing device for PCB's according to the invention contains an elastic 110, a fixing pillar 3, and a shaft 1. The elastic 110 is a spiral, elastic and conductive element.

The shaft 1 includes a head 10, a connected neck 11, and a post 12. The post 12 contains a fixing hole 13 engraved with threads. The outer diameter of the head 10 is greater than that of the neck 11. The head 10 goes through the through hole 80 of the PCB 8. A clamping hole 81 holds the neck 11. The post 12 goes through the elastic 110 and is fixed inside the fixing pillar 3.

The fixing pillar 3 contains a base 31 and a contact surface 30. The fixing pillar 3 is fixed onto the shell via the base 31. A screw 7 goes through an insert hole 32 to combine with the fixing hole 13, thereby fixing the shaft on the fixing pillar 3.

One end of the elastic 110 is in contact with the PCB 8, and the other end with the contact surface of the fixing pillar 5. Moreover, the elastic 110 and the fixing pillar are both conductive elements. Therefore, they can provide the grounding effect and prevent EMI.

Comparing FIGS. 12 and 8, one sees that the elastic washer 4 is similar to the elastic washer 2 in the first embodiment. The difference is in that the elastic washer 4 in the second embodiment has the opening facing upward while the elastic washer 2 in the first embodiment has the opening facing downward. The elastic washer 4 in the second embodiment further contains an extended surface 40, which has the same function as the junction surface 22 of the elastic washer 2 in the first embodiment. They are in direct contact with the PCB.

EFFECTS OF THE INVENTION

According to the disclosed fixing device for printed circuit boards, its shaft and fixing pillar are well known to the field and can be readily obtained. Both the elastic and elastic washer have simple structures that can be easily prepared. Not only can the invention achieve the objectives of absorbing external impacts and providing a good grounding effect, it further has the advantages of simple assembly and a lower manufacturing cost. Therefore, it is a great improvement over the prior art.

What is claimed is:

1. An assembly of a printed circuit board and a printed circuit board fixing device, comprising:
   a shell;
   a printed circuit board (PCB), the PCB having a through hole and a clamping hole extended from the through hole, a diameter of the through hole being greater than a width of the clamping hole; and
   a PCB fixing device for fixing the PCB on the shell, the PCB fixing device including:
      a fixing pillar fixed on the shell, the fixing pillar having an insert hole;
      an elastic washer, which is between the PCB and the fixing pillar to deform under pressure and generate an elastic force to push the PCB; and
      a shaft, which goes through the elastic washer and is inserted into and fixed to the fixing pillar, the top end of the shaft having a head and a connected neck with an outer diameter of the head greater than a diameter of the neck, so that the shaft is inserted into the PCB through the through hole and slid to the clamping hole for holding the connected neck, sandwiching the PCB between the head and the elastic washer, the shaft having a post inserted into the insert hole of the fixing pillar, a diameter of the post being smaller than the outer diameter of the head and the diameter of the connected neck.

2. The assembly of claim 1, wherein the fixing pillar is fixed on the shell using a nail.

3. The assembly of claim 1, wherein the shaft is connected to a nail penetrating through the shell and the bottom of the fixing pillar.

4. The assembly of claim 1, wherein the shaft is connected to a screw penetrating through the shell and the bottom of the fixing pillar.

5. The assembly of claim 1, wherein the elastic washer is a spiral elastic that is supported by the fixing pillar and deforms under pressure to generate an elastic force to push the PCB.

6. The assembly of claim 1, wherein the elastic washer is a bowl-shaped elastic washer containing a junction surface and an elastic part, the elastic part being supported by the fixing pillar, forming under pressure to generate an elastic force to push the PCB.

7. The assembly of claim 6, wherein the elastic part of the elastic washer has a plurality of claws extending in radial directions.

8. The assembly of claim 7, wherein the claws of the elastic washer extend toward the fixing pillar in a tilted way.

9. The assembly of claim 7, wherein the claws of the elastic washer extend toward the PCB in a tilted way.

10. The assembly of claim 1, wherein the elastic washer and the fixing pillar are both conductive, thereby connecting the PCB and the shell to the ground.

11. The assembly of claim 1, wherein the shaft and the fixing pillar are both conductive, thereby connecting the PCB and the shell to the ground.

* * * * *